(12) United States Patent
Blair et al.

(10) Patent No.: US 10,854,759 B2
(45) Date of Patent: Dec. 1, 2020

(54) TRENCHED MOS GATE CONTROLLED RECTIFIER

(71) Applicant: Diodes Incorporated, Plano, TX (US)

(72) Inventors: Peter Hugh Blair, Manchester (GB); Lee Spencer Riley, West Yorkshire (GB)

(73) Assignee: Diodes Incorporated, Plano, TX (US)

( * ) Notice: Subject to any disclaimer, the term of this patent is extended or adjusted under 35 U.S.C. 154(b) by 228 days.

(21) Appl. No.: 15/088,192

(22) Filed: Apr. 1, 2016

(65) Prior Publication Data

US 2017/0288065 A1    Oct. 5, 2017

(51) Int. Cl.

| | |
|---|---|
| *H01L 21/336* | (2006.01) |
| *H01L 29/861* | (2006.01) |
| *H01L 29/40* | (2006.01) |
| *H01L 29/423* | (2006.01) |
| *H01L 29/66* | (2006.01) |
| *H01L 29/739* | (2006.01) |
| *H01L 29/06* | (2006.01) |
| *H01L 29/16* | (2006.01) |
| *H01L 29/20* | (2006.01) |

(52) U.S. Cl.
CPC .......... *H01L 29/861* (2013.01); *H01L 29/404* (2013.01); *H01L 29/407* (2013.01); *H01L 29/4236* (2013.01); *H01L 29/66136* (2013.01); *H01L 29/7391* (2013.01); *H01L 29/8613* (2013.01); *H01L 29/0692* (2013.01); *H01L 29/1602* (2013.01); *H01L 29/1608* (2013.01); *H01L 29/2003* (2013.01)

(58) Field of Classification Search
CPC ............ H01L 21/3105; H01L 29/0661; H01L 29/0692; H01L 29/407; H01L 29/423; H01L 29/4236; H01L 29/6609; H01L 29/7827; H01L 29/861; H01L 29/42372; H01L 29/7397; H01L 29/7813; H01L 29/66348; H01L 29/66727; H01L 29/6634; H01L 29/66734; H01L 29/42376; H01L 29/0878; H01L 29/41766; H01L 29/42368; H01L 29/4238; H01L 29/42356; H01L 29/66666
See application file for complete search history.

(56) References Cited

U.S. PATENT DOCUMENTS

| | | | | |
|---|---|---|---|---|
| 5,326,711 | A * | 7/1994 | Malhi | ............... H01L 29/66348 257/E21.384 |
| 6,461,918 | B1 * | 10/2002 | Calafut | ............... H01L 29/0878 257/E29.04 |
| 7,285,812 | B2 * | 10/2007 | Tang | ................. H01L 21/28132 257/296 |
| 7,576,388 | B1 * | 8/2009 | Wilson | .................. H01L 29/407 257/330 |

(Continued)

*Primary Examiner* — Mary A Wilczewski
*Assistant Examiner* — Tsz K Chiu

(57) ABSTRACT

A trenched MOS gate controlled rectifier has an asymmetric trench structure between the active area of active trenches and the termination area of termination trenches. The asymmetric trench structure has a gate electrode on one side of the trench to turn on and off the channel of the MOS structure effectively and a field plate structure on the other side with field dielectric sufficiently thick in order to sustain the high electric field during the reverse bias condition.

9 Claims, 7 Drawing Sheets

(56) References Cited

U.S. PATENT DOCUMENTS

| | | | | |
|---|---|---|---|---|
| 8,203,181 B2* | 6/2012 | Hirler | ............... | H01L 29/7813 |
| | | | | 257/331 |
| 8,871,593 B1* | 10/2014 | Siemieniec | ....... | H01L 29/66727 |
| | | | | 438/272 |
| 8,884,367 B2* | 11/2014 | Girdhar | ............... | H01L 29/407 |
| | | | | 257/339 |
| 9,184,261 B2* | 11/2015 | Kobayashi | ............ | H01L 29/407 |
| 9,812,535 B1* | 11/2017 | Haase | ................... | H01L 29/407 |
| 9,859,416 B2* | 1/2018 | Mori | .................. | H01L 29/1083 |
| 10,256,229 B2* | 4/2019 | Naito | .................. | H01L 29/0696 |
| 2006/0273386 A1* | 12/2006 | Yilmaz | ............... | H01L 29/407 |
| | | | | 257/330 |
| 2010/0244125 A1* | 9/2010 | Sonsky | ............... | H01L 29/407 |
| | | | | 257/330 |
| 2011/0156140 A1* | 6/2011 | Zara | .................. | H01L 21/2815 |
| | | | | 257/334 |
| 2012/0326227 A1* | 12/2012 | Burke | ................. | H01L 29/407 |
| | | | | 257/330 |
| 2013/0221436 A1* | 8/2013 | Hossain | ............... | H01L 29/407 |
| | | | | 257/334 |
| 2013/0240984 A1* | 9/2013 | Cheng | ................ | H01L 21/2815 |
| | | | | 257/330 |
| 2013/0307066 A1* | 11/2013 | Hsieh | ................. | H01L 29/7827 |
| | | | | 257/331 |
| 2014/0264567 A1* | 9/2014 | Challa | ................ | H01L 29/7827 |
| | | | | 257/330 |
| 2014/0367773 A1* | 12/2014 | Poelzl | .............. | H01L 29/66666 |
| | | | | 257/330 |
| 2015/0349050 A1* | 12/2015 | Fang | ................ | H01L 29/41758 |
| | | | | 257/339 |
| 2016/0204106 A1* | 7/2016 | You | .................... | H01L 29/0657 |
| | | | | 257/401 |

* cited by examiner

TRENCHED MOS GATE CONTROLLED RECTIFIER

BACKGROUND

The first generation MOS gate controlled rectifiers from Diodes Incorporated, under the name of Super Barrier Rectifier (SBR), have planar MOS structures in which forward current is conducted through a channel in the body region. The gate terminal, which is electrically tied to the anode in the device, makes it necessary that the body region be very lightly doped to the point where the channel is partially formed even when the anode and the cathode are at the same potential.

In such a device, current $I_f$ flows between the anode and the cathode under a forward bias and a voltage drop $V_f$ develops between the two terminals, and product of $I_f$ and $V_f$ represents one aspect of the power loss in the rectifier. The measured voltage drop $V_f$ can be modeled as the sum of voltage drops associated with several resistances in series. They include the channel resistance, the drift region (epitaxial layer or epi layer) resistance, the substrate resistance, and connection resistances to the anode and the cathode.

Ideally, current ceases to flow when the rectifier is under reverse bias. Practically, however, leakage current exists. Product of the leakage current and the reverse bias voltage, then, represents another aspect of the power loss in the rectifier.

Further lowering the body doping can lower its contribution to $V_f$. But this is achieved at the expense of increased channel leakage under reverse bias. In practice the $V_f$ is limited by the level of leakage the target application can stand, and the balance of losses between forward bias and reverse bias conditions.

The second generation SBR products from Diodes Incorporated significantly reduced the $V_f$ by increasing channel density, placing gate electrodes inside vertical trenches. These devices perform very well for up to 100V, but the advantages at still higher voltages are not so pronounced because of the need to increase the drift region (epi layer) thickness in order to sustain the higher voltages and which leads to the consequential increase in resistance.

In U.S. Pat. No. 4,941,026, Temple discloses a charge controlled structure in which the use of extended gate electrodes within vertical MOS gated devices enables further reduction of the epi layer thickness. The electrostatic effect exerted by the extended portion of the gate electrode, which is shielded by a thicker dielectric film than the gate dielectric controls the charges within the drift region between the trenches such that a higher breakdown voltage can be achieved than by a planar junction using the same epi resistivity.

Several MOSFET suppliers have subsequently developed trench structures, commonly called "split gate" MOSFETs, to benefit from having a gate and an extended shield electrode in the same trenches and separated and isolated from each other by a dielectric layer. In these structures the shield electrode is maintained at source potential whilst the gate electrode is modulated to turn the MOSFET on or off.

Split-gate MOSFET structures are also commonly implemented in trench termination structures. Such structures are often manifested as several concentric trenches enclosing the mesa array in the active area of the device. These termination trench structures have a field plate, which are isolated from the anode and from the cathode by the same dielectric material as in the active trenches.

SUMMARY OF THE INVENTION

The present Inventors recognize that, brute force attempts to further reduce epi layer doping and its thickness in order to further reduce $V_f$ and increase breakdown voltage of a MOS gated trench rectifier will run into two problems and can result in loss of control of leakage current or breakdown voltage, or both, for the following reasons.

First, if termination trenches adopt the thin gate oxide for the field plate to control leakage current during reverse bias, catastrophic breakdown failure results in the termination trench that is closest to the active area. This is because the electric field under reverse bias pushes up into the termination mesa and exerts a electric field on the thin shield dielectric layer that is higher than it can sustain and results in rupture of the oxide at the terminating trenches. The inescapable conclusion is that gate oxide must be excluded from terminating trenches.

Second, if the termination trenches adopt the thicker shield oxide in order to avoid rupture at reverse bias, the device cannot exert sufficient field on the mesas next to the trench to turn the channel off sufficiently and excessive leakage results in at least the outermost active mesa next to the termination trench. This is because while within the active area the presence of a reverse biased on the thin oxide gate can turn the channel off to stop current flow; the lack of a thin oxide gate on the terminating trench at the outermost contacted mesa leaves the channel partially open to leakage under reverse bias.

The Inventors recognize that the conflicting requirements of the dielectric layer thickness is at the root of the problem of leakage problem and the voltage blocking problem, and a novel device structure is needed to raise the operating voltage of the trench SBR devices and to hold the leakage current to within tolerable limits, and also to take advantage of the trench field plate to further reduce $V_f$ through reduction of drift region resistance. The Inventors then endeavored to invent and manufacture a novel device structure, which enables the active trenches to effectively switch current on and off, and the termination trenches to sustain high reverse voltage.

The following exemplary device is briefly described in order to summarize the invention. The device functions to switch a current on and off between an anode and a cathode, two terminals disposed on the two principal surfaces of a semiconductor chip. An array of active trenches is disposed at the center, active region of the chip. Enclosing the active area at the periphery of the device is a termination area in which termination trenches are disposed. The configuration of the active trenches is calculated to meet the on-resistance requirements, or the amount of current that must be switched on and off; and the configuration of the termination trenches is calculated to shape of the electric field in the chip to prevent electric premature field induced breakdown when the device is under reverse bias. And between the active area and the termination area is disposed an asymmetric trench. The asymmetric trench is structured for both switching a current and to block a reverse voltage.

The active trench and the termination trench are structurally symmetrical with respect to an imaginary center plane that runs along the middle of the trench in parallel to the two opposing sidewalls of the trench. They each have a similar field plate member that extends from the chip surface to near the bottom tip of the trench and separated from the trench sidewalls and the bottom tip by a layer of relatively thick dielectric material. In the active trenches, a top portion of this thick dielectric material is replaced by the combination of a gate electrode and a thinner layer of gate dielectric that separates the gate electrode from the trench walls and from the field plate.

The asymmetric trench is disposed at the border of the active area and the termination area. One side of the asymmetric trench faces the active area and the other side of the asymmetric trench faces the termination area. Unlike the active trench and the termination trench, this transitional trench is structurally asymmetric with respect to the imaginary center plane. The half structure that faces the active area is similar to an active trench and is capable of effectively switching a current on and off; the other half structure of the asymmetric trench that faces the termination area comprises a thick oxide similar to other termination trenches and can contribute to the shaping of the electric field in the device to alleviate premature breakdown under reverse bias.

DETAILED DESCRIPTION

Definition of Terms

The terms used in this disclosure generally have their ordinary meanings in the art. Certain terms are discussed below to provide additional guidance to the practitioners regarding the description of the invention. It will be appreciated that the same things can be described in more than one way. Consequently, alternative language and synonyms may be used.

A semiconductor device chip or a chip in the context of this disclosure and claims means a slab of semiconductor material such as silicon, germanium, silicon carbide, diamond, gallium arsenide, and gallium nitride, or their combinations. The top and the bottom surfaces of the chip usually are two parallel principal crystallographic planes such as {100} or {110} planes of a silicon crystal. Integrated circuits and discrete circuit devices can be built in and on the top surface of the chips. In this disclosure, the term top surface of the chip or chip surface means the top surface plane of the semiconductor device chip where most of the device components are located; the bottom surface mean the bottom surface plane opposite the top surface.

Figure 1:
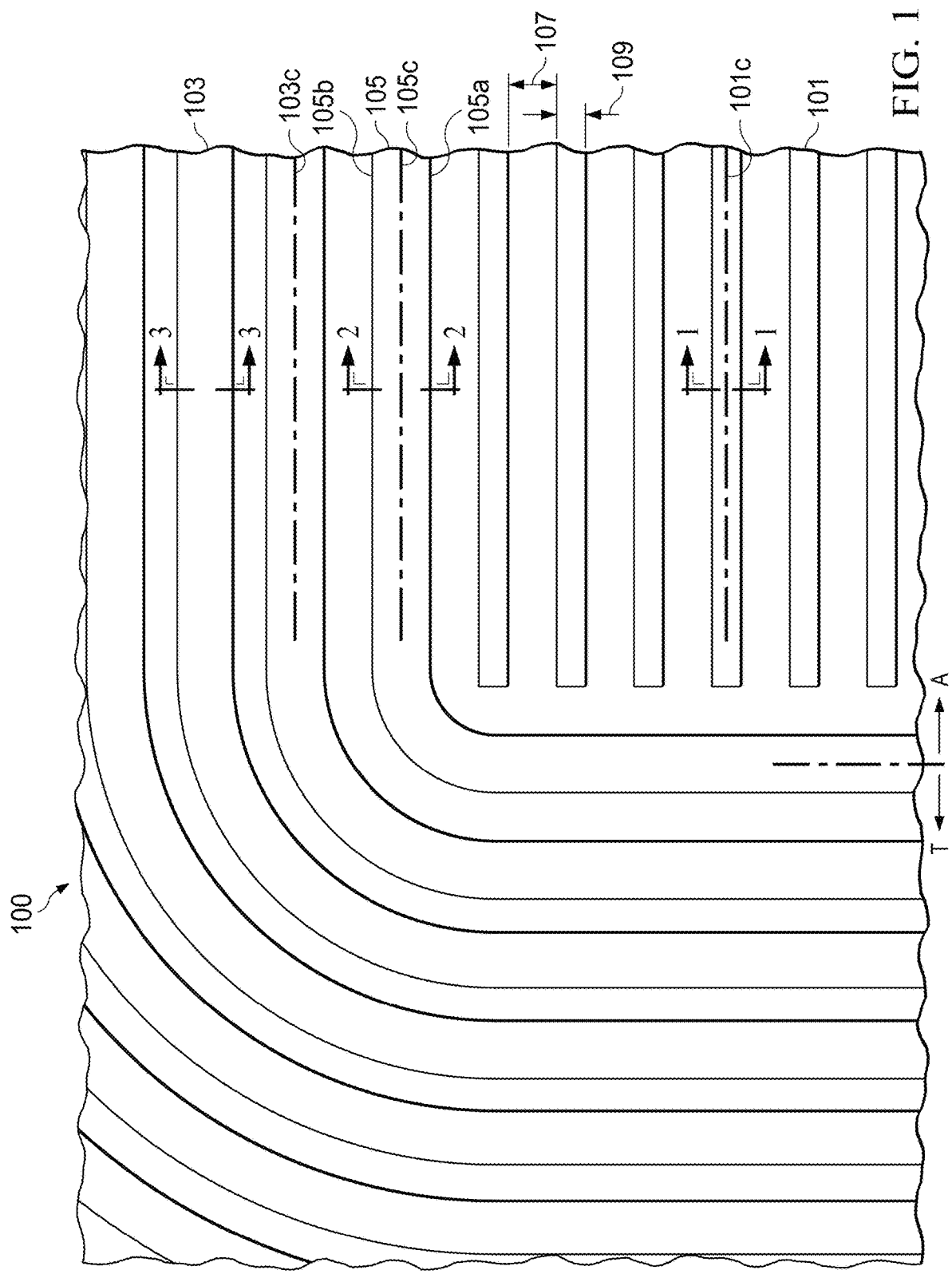
FIG. 1 depicts a schematic top view of a portion of a semiconductor device, which embodies aspects of this invention.

A trench is a structural element that is built into the bulk of a chip perpendicular to the chip surface. Trenches are usually formed by removing material from where a patterned photoresist is absent. The removal of material is usually done with a reactive ion etching process. Trenches when viewed from the chip surface usually have repetitive long-striped pattern, such as depicted in FIG. 1 of this paper. The walls of a trench are the vertical or near vertical surfaces of the semiconductor material extending from the top of the chip into the bulk of the chip. In this disclosure and claims, the width of a trench is the distance between the two opposing trench walls and the length of the trench coextends with the long stripe and is orthogonal to the width of the trench. The depth of a trench is measured perpendicular to the top of the chip and is the distance from the top surface of the chip to the bottom of the trench, which is the endpoint of the etching step. In the context of this disclosure and claims, the aspect ratio—the ratio of the trench depth to trench width is defined as greater than 1.5. The center of the trench means an imaginary plane about equidistant from the two opposite sidewalls of a trench.

A mesa in the context of this disclosure and claims is a region of semiconductor material between two adjacent trenches, its depth is defined by the depth of the neighboring trenches and its width may be comparable, wider or narrower than the width of the trenches.

An active trench in the context of this disclosure and claims is a trench of which a portion of the trench walls provides a current path in the semiconductor device when bias voltages are properly applied to the device.

A termination trench in the context of this disclosure and claims is a trench that does not provide a current path under normal operation conditions. It is usually located close to the periphery of the device chip and serves to shape the electric field in the device.

A field plate in a semiconductor device is a conductive member disposed near a p-n junction for the purpose of shaping the electrical field distribution near the p-n junction. The field plate may comprise metal or polysilicon. In the context of this disclosure and claims the conductive member may be disposed inside a trench to increase the breakdown voltage of the p-n junction between the body region and the drift region.

An asymmetric trench in the context of this disclosure and claims comprises a trench with an active half trench structure on one side and a termination half trench structure on the other side of the trench.

A gate dielectric layer in the context of this disclosure and claims is a layer of dielectric material such as $SiO_2$, for modulating the electric potential of a semiconductor surface to create or to destroy a conductive channel at the semiconductor surface near the dielectric layer.

A field plate dielectric layer in the context of this disclosure and claims is a dielectric layer that lines the sidewalls of the termination trenches, and portions of the active trenches where the field plate is adjacent to the trench sidewalls without an intervening gate electrode.

In the context of this disclosure and claims, filling and lining are two process steps for adding material to the inside of a trench. Filing means to completely fill the inside of a trench to the extent that is practicable in the current manufacturing process. For example, in a chemical vapor deposition process, depending on the aspect ratio of the trench to be filled, it may leave a crevice at the middle of the trench due to the necking effect of the process. Lining means forming a layer either by thermal oxidation or by deposition of a conformal film to cover only the surface of the trench walls and leave a gap at the middle of the trench.

Similarity in the context of this disclosure and claims means when two quantities are said to be similar, it is understood to mean they are equal or close to be equal within the semiconductor device process limitation and measurement, not necessarily mathematically equal.

In the context of this disclosure and claims, when a process is performed on "only one side" of a trench, it means the process is so performed that the effect does not manifest on the "opposite side" of the same trench.

An Ohmic contact in the context of this disclosure and claims means a non-rectifying junction between a conductor and a semiconductor, or between two conductors, that has a linear current-voltage (I-V) relationship according to Ohm's law.

When an object is described in this disclosure and claims as being adjacent to another object, the two objects are understood to be lying near, close, or contiguous to each other. They are neighboring to each other. There may be other objects between them but the intervening object should be of dissimilar nature and character.

Detailed Description of Exemplary Embodiments

FIG. 1 depicts the top view of a portion of a semiconductor device 100 that embodies some aspects of this invention. The depicted device 100 comprises trenches including active trenches 101, termination trenches 103, and an asymmetric trench 105.

The active trenches 101 as depicted are generally parallel to one another, each with a width 109. Mesas 107 separate the trenches. The widths of the active trenches in this exemplary device 100 are equal, so are the widths of the mesas. In other device designs embodying this invention, the widths of the active trenches may be different from one another, so are the widths of the mesas.

The termination trenches 103 are disposed near the periphery T of the semiconductor device 100 and form rings enclosing the active trenches in the active area A of the device.

In this embodiment, the width of the termination trenches is wider than that of the active trenches. As a result, even though both groups of trenches may be formed concurrently during the fabrication process, the depth of the termination trenches is deeper than that of the active trenches due to what is known in the art as the micro-loading effect.

The active trenches 101 and the termination trenches 103 are symmetric trenches with respect to respective imaginary plane 101c and 103c, which runs along the center of the trenches.

Trench 105, which is between the active trenches 101 and the termination trenches 103, is asymmetric with respect to its center plane 105c. One side 105a adjacent to the active trenches 101 is similarly structured as the active trenches 101; the other side 105b adjacent the termination trenches 103, is differently structured and is similar to the termination trenches 103. This asymmetric trench 105 separates the active area A from the termination area T.

Figure 2:
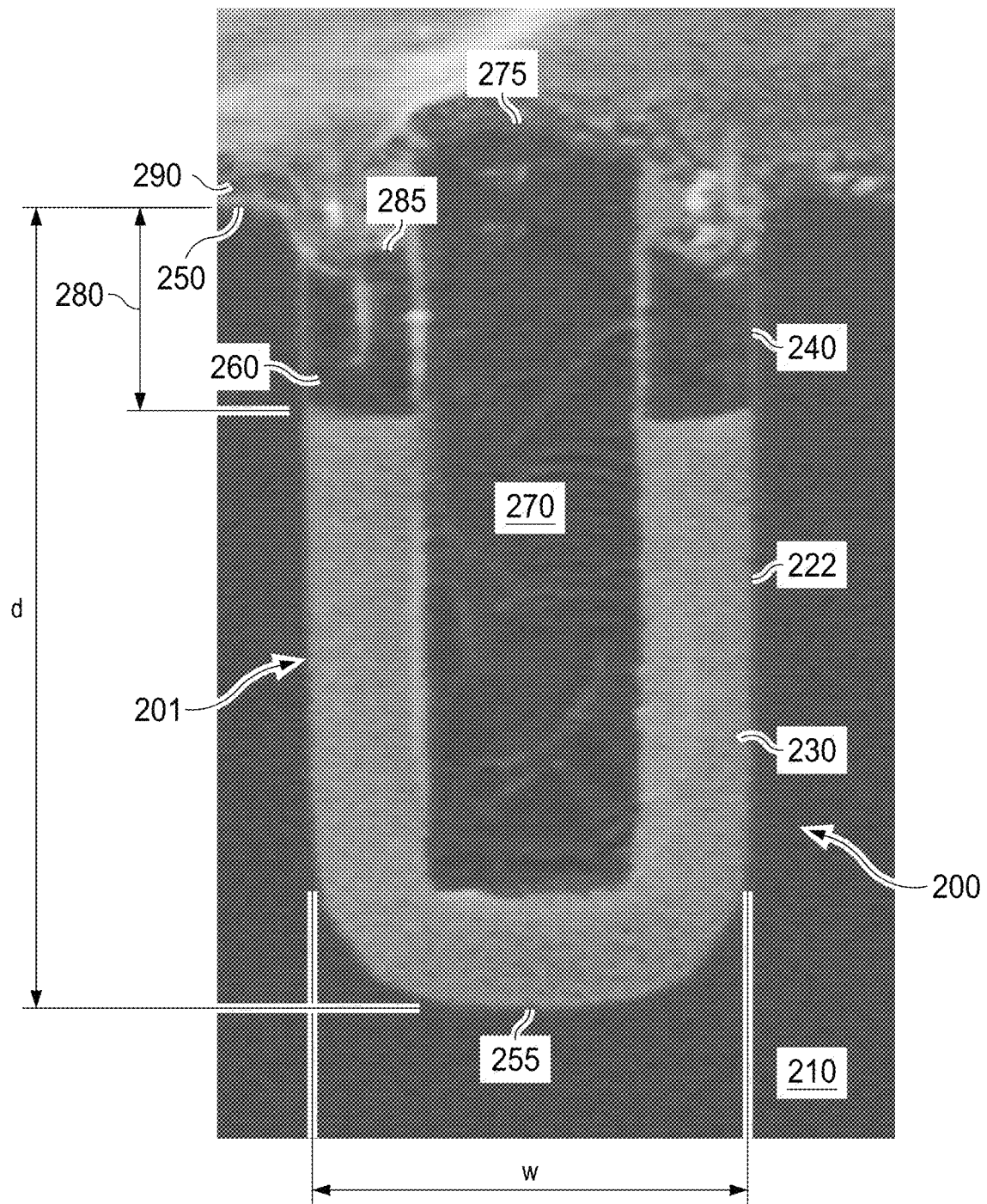
FIG. 2 is a scanning electron microscopic photograph of the cross section of an active trench structure embodying aspects of this invention.

FIG. 2 is a scanning electron microscopic photograph of the cross section of an exemplary active trench structure 201 of a semiconductor device 200, which embodies certain aspects of this invention. The microscopic photograph is taken, for example, in a section plane 1-1 in FIG. 1 along the width of an active trench 101.

The example semiconductor chip 210 comprises a silicon substrate and an epitaxial layer on the substrate. The active trench 201 is formed by removing silicon from the top 250 of the epitaxial layer with, for example, a reactive ion etch process. The aspect ratio of the trench, that is the depth d, measured from the chip top surface 250 to the bottom 255 of the trench, to the width w of the trench, measured between the opposing trench sidewalls 222 near the top surface 250 of the chip is about 1.7. Other aspect ratios may be adopted for other application of this invention, but the aspect ratio should be no less than 1.5 for the device to be practical.

The two sidewalls 222 of the trench are substantially vertical to the chip surface 250 and are lined, along with the bottom surface of the trench with dielectric layers 230 and 240, which in this embodiment are silicon dioxide. Other applications may choose to use different dielectric materials such as silicon nitride.

The two dielectric layers 230 and 240 serve different functions in the semiconductor device 200. Layer 230 is thicker than layer 240 and is calculated to sustain the electric field of a reverse bias voltage without breaking down. Layer 240 serves as the gate dielectric and is calculated to turn on the device at forward bias condition and turn off the device at the absence of the forward bias. In the embodiment depicted in FIG. 2, the thickness of the layer 230 is in the range of 0.2-0.8 μm and the thickness of the layer 240 is in the range of 5-50 nm. Other ranges may be adopted depending of the applications.

In contact with the gate dielectric layer 240 in the trench 201 is a conductive element 260, which functions in device 200 as the gate electrode. In the example device 200, the gate electrode 260 comprises doped polysilicon. When a forward bias voltage above a threshold voltage is applied to the gate electrode 260, a conductive channel forms next to the gate dielectric in a semiconductor mesa and through which electric current may flow. When a reverse bias is applied to the gate electrode, the channel collapses and electric current ceases to flow. The length 280 of the gate electrode 260 corresponds approximately to the channel length of the device 200.

At the center portion of the trench 201 is a field plate 270 of a conductive material. In this example device 200, the field plate comprises doped polysilicon. The field plate 270 extends from above the chip surface 250 to the dielectric 230 that lines the bottom of the trench 201.

Over the field plate 270 and over the gate electrodes 260 on both sides of the field plate is a layer of conductive material 290. This layer may comprise more than one conductive layer. In device 200, this metal layer 290 comprises metal silicide such as titanium silicide, which makes ohmic contacts to the field plate at its top surface 275 and to the gate electrodes at their top surface 285 and to the mesa surface 250.

When device 200 is forward biased, an n-channel is formed next to the gate dielectric layer 240 in a p-body region that extends from mesa surface 250 to near the gate length 280. Polarities of dopant may change in other embodiments to result in a p-channel formed in n-body region.

Figure 3:
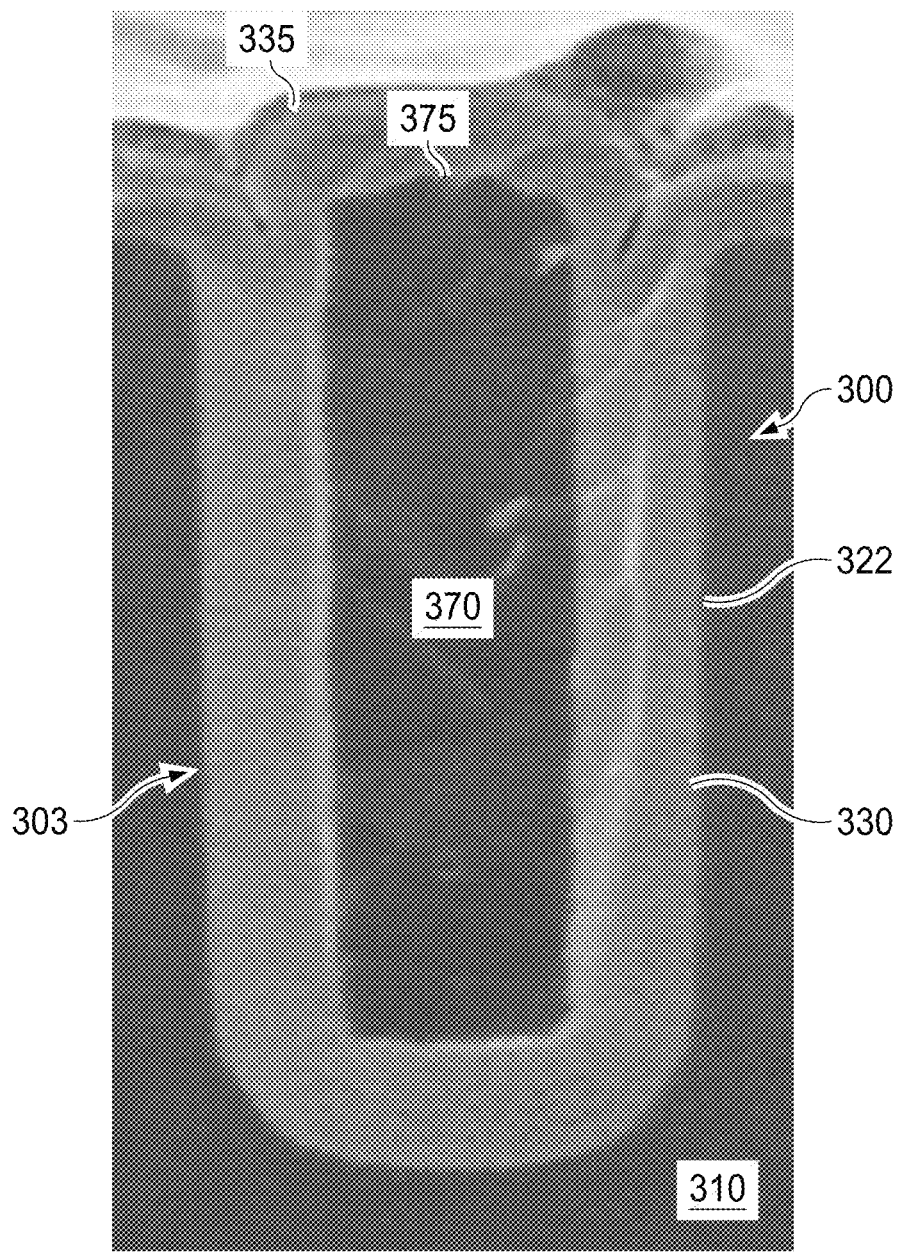
FIG. 3 is a scanning electron microscopic photograph of the cross section of a termination trench structure embodying aspects of this invention.

FIG. 3 is a scanning electron microscopic photograph of the cross section of an example termination trench 303 structure in a semiconductor device 300, which embodies some aspects of this invention. The microscopic photograph is taken, for example, in a section plane 3-3 in FIG. 1, along the width of a termination trench 103.

The termination trench 303 in the semiconductor chip 310 is, in many aspects, similar to the active trench 201 as depicted in FIG. 2. Two aspects, at least, differentiate an example termination trench 303 from an example active trench 201.

First, there are no gate electrodes and no gate dielectric layer in the termination trench 303. Both sidewalls 322 are lined with dielectric material 330 of a rather uniform thickness. As a result, no conductive channel forms, during normal operation, next to the dielectric material 330 in the mesa region adjacent trench 303.

Second, the field plate 370 is capped at the top surface 375 by a layer of dielectric material 335. The electrical potential of the field plate 370 therefore is not fixed either to the anode voltage or to the cathode voltage—it seeks a potential between the two terminal voltages based on electrodynamics.

Figure 4:
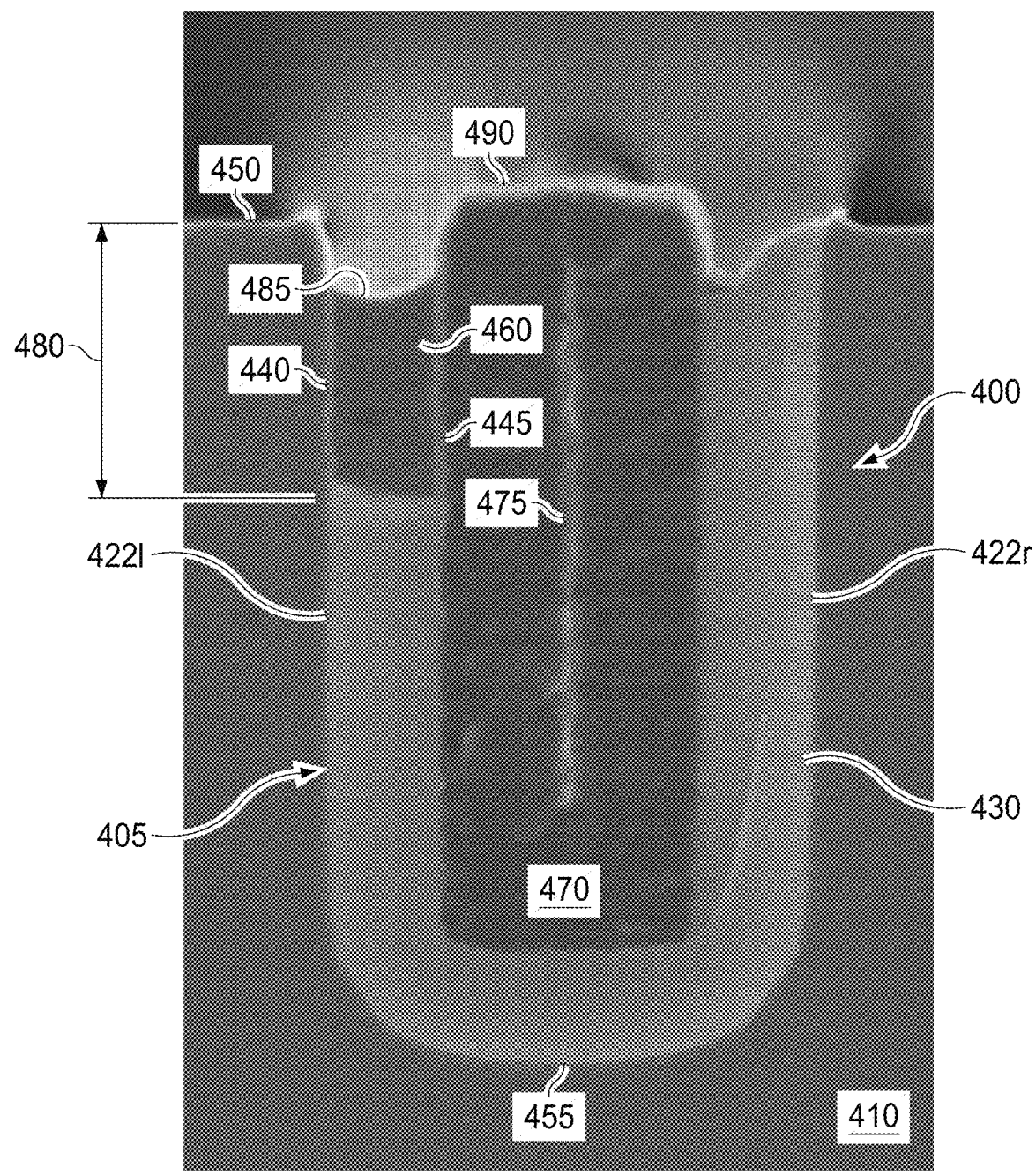
FIG. 4 is a scanning electron microscopic photograph of the cross section of an asymmetric trench structure embodying aspects of this invention.

FIG. 4 is a scanning electron microscopic photograph of the cross section of an example asymmetrical trench 405 structure in a semiconductor device 400, which embodies some aspects of this invention. The microscopic photograph is taken, for example, in a section plane 2-2 along the width of an asymmetrical trench 105 in FIG. 1. The asymmetric trench 405 shares some characteristics with the active trench 201 and the termination trench 303 but are different from both trenches in certain aspects.

Semiconductor chip 410 is similar to chip 210 in FIG. 2 and chip 310 in FIG. 3 in many ways. The trench 405 may be formed similarly as the trench 201 and 303 and may have similar aspect ratios. The two sidewalls 422l and 422r in this example structure are substantially vertical to the chip surface 450 although they may form an angle to the chip surface other than an right angle. The lower portion of the sidewalls and the bottom 455 of the trench are lined with a thick dielectric layer 430. The middle of the trench is filled with a conductive field plate 470 that extends from approximately the chip surface 450 to near the bottom of the trench 455.

The structure near the upper portion of the trench 405, however, gives it the asymmetric appearance. As depicted in FIG. 4, the entire right sidewall 322r of trench 405 is lined with the thicker dielectric layer 430; while the upper portion of the left sidewall 422l of this example trench is lined with a gate dielectric layer 440. Both dielectric layers in this embodiment comprise silicon dioxide. Other dielectric materials known in the art such as silicon nitride may also be used.

Another differentiating aspect is that only one gate electrode 460 is disposed in the asymmetric trench. The gate electrode 460, similar to the gate electrodes in the active trenches, is disposed between the gate dielectric 440 and the field plate 470 and is similarly isolated from the field plate by a dielectric material 445. In this embodiment, the dielectric material 445 and the gate dielectric 440 are formed concurrently although they may be different in thickness.

At the center of the asymmetric trench 405 is the field plate 470, which comprises a conductive material, which fills the trench to the top surface 450 and slightly beyond. The field plate 470 at its bottom is separated from the trench by a layer of dielectric material, such as silicon dioxide. A crevice 475 may be observed in the middle of the field plate 470 in some embodiments. It is a vestige of a chemical vapor deposition process with which the field plate 470 is formed.

When the exemplary device 400 is under forward bias voltage supplied to a conductive member 490, which is in contact with the field plate 470 and the gate electrode 460 at its top 485, an n-channel forms next to the gate dielectric layer 440 near the left sidewall 422l in a p-body region.

Figure 5:
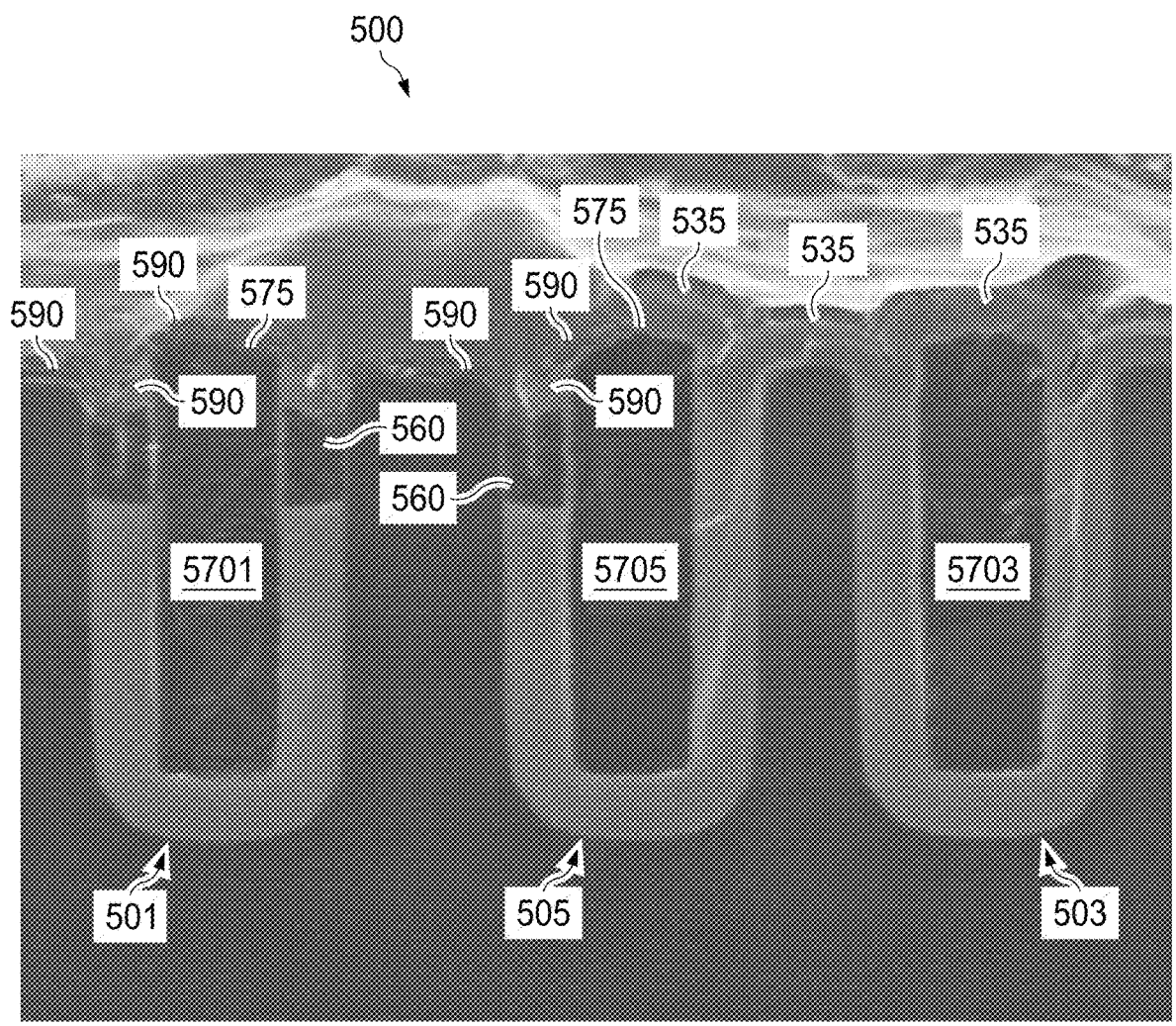
FIG. 5 is a scanning electron microscopic photograph of the cross section of a structure of multiple of trench structure embodying aspects of this invention.

FIG. 5 is a scanning electron microscopic photograph of the cross section of an example device 500 in a partially completed stage. After its completion, the device may be assembled in various packages known in the art, one example is a single-in-line (SIP) package; another example is a multi-chip package in which device 500 in a chip form may be packaged with a controller chip. Device 500 comprises a termination trench 503, an active trench 501, and an asymmetrical trench 505 between the termination trench and the active trench.

The structure of the termination trench 503 is similar to the termination trench as depicted in FIG. 3; the structure of the active trench 501 is similar to the active trench as depicted in FIG. 2; and the structure of the asymmetric trench 505 is similar to the asymmetric trench as depicted in FIG. 4. There is a conductive layer 590 that extends over, and contacts to, the top of the active trench 501 and terminates at the middle of the asymmetric trench 505. It makes ohmic contact to the gate electrodes 560 in the active trench structure 501 and in the asymmetric trench structure 505. It also makes ohmic contact 575 to the field plate 5701 of the active trench structure 501 and to the field plate 5705 of the asymmetric trench structure 505. It also makes ohmic contact to the mesa surfaces adjacent to trench 501.

Disposed over the top of the termination trench 503 and the right portion of the asymmetric trench 505 is a dielectric layer 535, which electrically shields the field plate 5703. Conductive layer 590 may extend over layer 535.

FIGS. 6a, 6b, 6c, and 6d depict the schematic cross sectional views of an asymmetric trench structure in different states of partial completion.

Figure 6A:
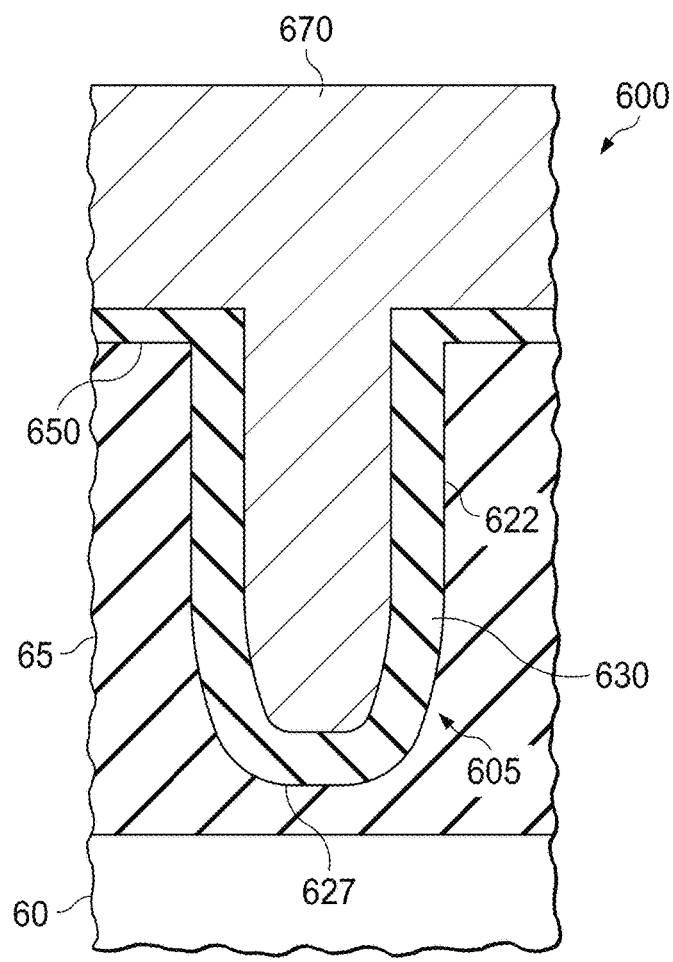
FIGS. 6a 6b, 6c, and 6d depict schematic cross sectional views of an asymmetric trench structure in different states of partial completion.

FIG. 6a depicts a partially completed device with a trench 605 in a semiconductor wafer. The wafer comprises a heavily doped substrate 60 and a less heavily doped epitaxial layer 65. In this exemplary device, the semiconductor is silicon, and the dopant for both the substrate and the epitaxial layer is n-type, such as phosphorous. The layer 630, which in device 600 is silicon dioxide, covers the chip surface 650 and the two opposite trench sidewalls 622 and trench bottom 627. The trench bottom has rounded corners. The layer 630 may be chemically deposited or thermally grown. The thickness of this layer is dictated by the operating conduction of the finished device, especially the maximum reverse bias voltage. The wafer top and the inside of the trench are coated with a conductive material 670, which in this exemplary device 600 is doped polysilicon.

Figure 6B:
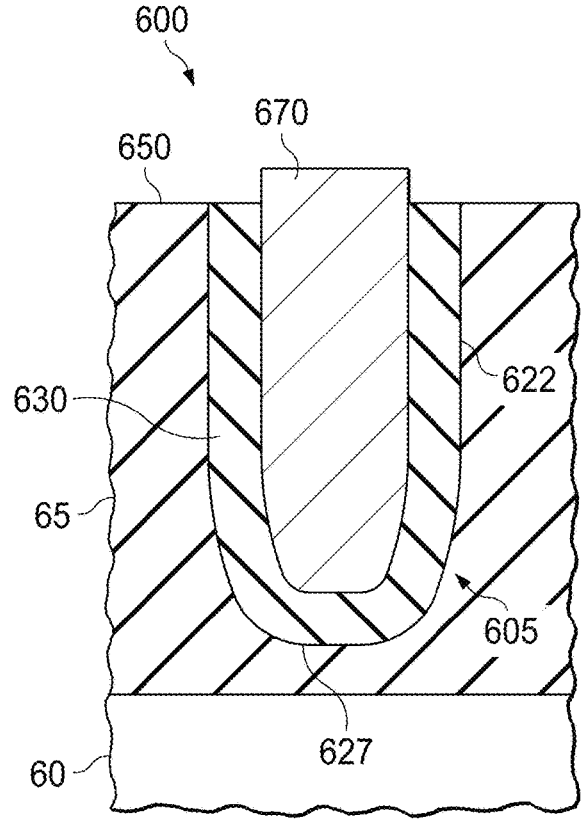

FIG. 6b depicts the device 600 at a later stage of fabrication. Here the polysilicon is etched from the top of the wafer. Afterwards a portion of silicon dioxide layer 630 is removed to expose the chip surface 650.

Figure 6C:
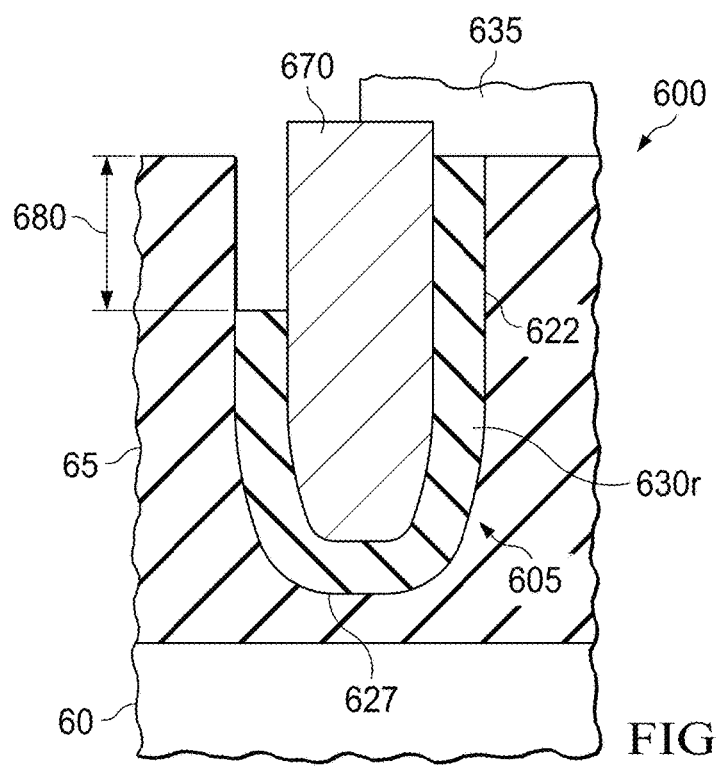

FIG. 6c depicts the asymmetric trench structure at yet a later stage of fabrication. At this stage, the silicon dioxide on one sidewall of the trench is etched down to a depth 680. The etchant used in the removing process is chosen to have good etching selectivity with respect to silicon, so the single crystal silicon layer mesa and the polysilicon in the trench are preserved. The silicon dioxide 630r on the opposite sidewall is protected from etchant by a patterned photo resist layer 635.

A termination trench may be fabricated in the device 600 concurrently with the asymmetric trench 605 by extending the photo resist pattern 635 to cover the silicon oxide on both sidewalls of a trench such as one depicted in FIG. 6b so the silicon dioxide inside the trench on both sidewalls remains un-etched. An active trench may also be fabricated in the device 600 concurrently with the asymmetric trench 605 and a termination trench by uncovering the silicon dioxide on both sidewalls of the intended active trench and etching to the same depth 680.

Figure 6D:
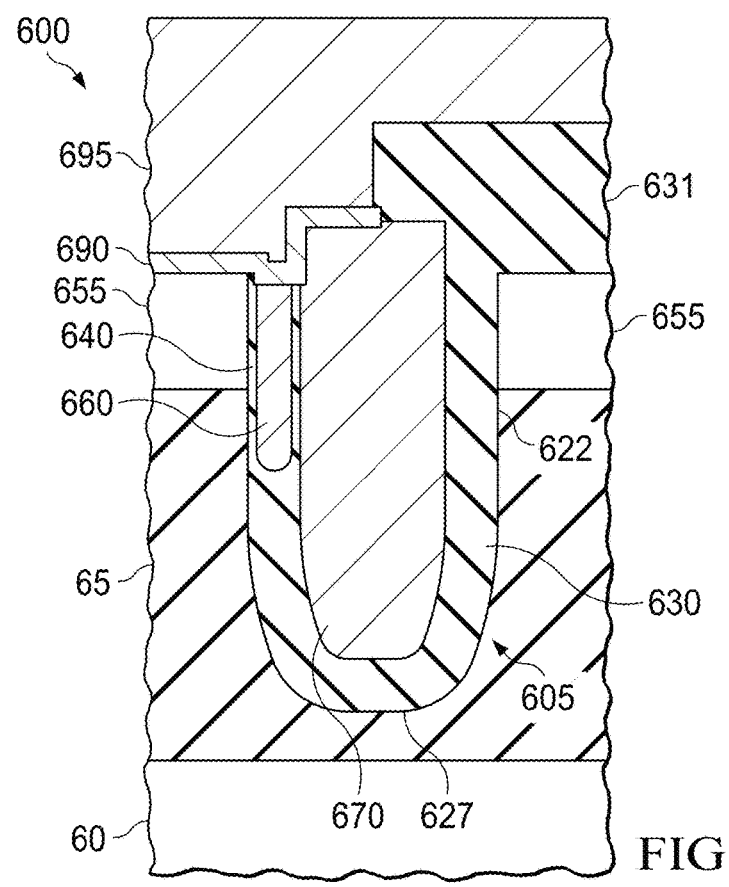

FIG. 6d also depicts a gate dielectric film 640, which lines the upper portion of the trench sidewall from which silicon dioxide 630 was previously removed in a process step as depicted in FIG. 6c. In this exemplary device, the gate dielectric film also comprises silicon dioxide. Other gate dielectric material such as silicon nitride may be used in other implementations of this invention.

Between the gate dielectric film 640 and the field plate 670 is the gate electrode 660, which comprises a conductive material. In this exemplary device 600, the material comprises doped polysilicon. Other conductive material such as refractory metals may also be used as the gate electrode.

FIG. 6d also depicts a conductive layer 690, which covers and makes ohmic contact to the gate electrode 660 and the field plate 670. The conductive layer 690 also makes ohmic contact to the top surface 650 of the mesa adjacent to the trench in the epi layer 65.

In the device 600, the top portion of the epi layer 655 may be doped with a dopant of the opposite polarity to that in the substrate 60 and the lower portion of the epitaxial layer 66. On such dopant is boron. In the exemplary device 600, which is a MOS gate controlled rectifier, the doped region comprises the body region 655 in which conductive channel forms when the rectifier is appropriately biased. If Schottky diode is part of device 600, that portion of the epi layer is shielded from boron doping.

Over the right side of the trench structure 605 where the silicon dioxide 630 remains un-etched, there is a layer of dielectric material 631. The edge of the dielectric material 631 buts against the edge of the conductive layer 690 so the mesa top to the right of the trench 605 is not in contact with the conductive layer 690. Dielectric material 631 is also disposed over the termination trench fabricated concurrently with the asymmetric trench of device 600.

The conductive layer 690 in this exemplary device comprises titanium silicide. Other metals such as platinum silicide may also be used if a Schottky diode is to be fabricated in the device 600.

Additional metal such as copper or aluminum 695 may be added to the top of the conductive 690 in order to reduce the device total resistance along the current path.

FIG. 1 is a portion of an actual device layout and FIGS. 2-5 are scanning electron micrographs of silicon wafers in which devices of layout in FIG. 1 are implemented. FIGS. 6a-6d, however, are computer generated graphics and the elements in them are not drawn to actual proportion for the purpose of clarity in illustration.

We claim:

1. A semiconductor chip, comprising:
   an asymmetric trench structure disposed at the border of an active area and a termination area of the semiconductor chip, the asymmetric trench structure comprising;
   a first trench with opening at a top surface of the chip and having a first and a second sidewalls of an epitaxial semiconductor material, the first sidewall adjacent to the active area and the second sidewall adjacent to the termination area;
   a field plate in the first trench, extending from the top surface into first trench; and
   a second trench in the first trench, the second trench with opening at near the top surface, having sidewalls of dielectric material,
   a gate electrode disposed in the second trench on one side of the field plate near the first sidewall and no gate electrode disposed on the opposite side of the field plate near the second sidewall; and
   a first symmetrical trench, structure adjacent to the asymmetrical trench structure, disposed in the active area; and a second symmetrical structure adjacent to the asymmetrical trench structure, disposed in the termination area; wherein a conductive layer extends over and is in contact with a gate electrode and a field plate of the first symmetrical trench and contacts the gate electrode and the field plate of the asymmetrical trench structure.

2. The semiconductor chip of claim 1, in which the gate electrode is separated from the sidewall of the epitaxial semiconductor material by a first dielectric layer of a first thickness and separated from the field plate by a second dielectric layer of a different thickness from the first thickness.

3. The semiconductor chip of the claim 2, in which the gate electrode and the field plate are connected by a conductive layer at near the top surface of the chip.

4. The semiconductor chip of claim 1, in which the first symmetric trench and the second symmetric trench structure are disposed adjacent to the asymmetric trench structure.

5. The semiconductor chip of claim 4, in which the first symmetric trench has two gate electrodes adjacent to sidewalls of the first symmetric trench.

6. The semiconductor chip of claim 5, in which the second symmetric trench has no gate electrode.

7. The semiconductor chip of claim 6, in which the one gate electrode in the asymmetric trench is separated from a sidewall of the epitaxial semiconductor material by a gate dielectric.

8. The semiconductor chip of claim 7, further comprising a first mesa separating the asymmetric trench from the first symmetric trench and a second mesa separating the asymmetric trench from the second symmetric trench.

9. The semiconductor chip of claim 8, in which a conductive layer connects the first mesa at the top surface of the chip and the field plate but does not connect the second mesa at the top surface of the chip.

* * * * *